US012315706B2

(12) United States Patent
Liu (10) Patent No.: US 12,315,706 B2
(45) Date of Patent: May 27, 2025

(54) CARRIER DEVICE, SEMICONDUCTOR APPARATUS, AND RESIDUAL CHARGE DETECTION METHOD (71) Applicant: BEIJING NAURA MICROELECTRONICS EQUIPMENT CO., LTD., Beijing (CN)

(72) Inventor: Jian Liu, Beijing (CN)

(73) Assignee: BEIJING NAURA MICROELECTRONICS EQUIPMENT CO., LTD., Beijing (CN)

( * ) Notice: Subject to any disclaimer, the term of this patent is extended or adjusted under 35 U.S.C. 154(b) by 279 days.

(21) Appl. No.: 17/912,501

(22) PCT Filed: Mar. 8, 2021

(86) PCT No.: PCT/CN2021/079473
§ 371 (c)(1),
(2) Date: Sep. 17, 2022

(87) PCT Pub. No.: WO2021/185103
PCT Pub. Date: Sep. 23, 2021

(65) Prior Publication Data
US 2023/0138394 A1 May 4, 2023

(30) Foreign Application Priority Data

Mar. 18, 2020 (CN) .......................... 202010192003.5

(51) Int. Cl.
*H01J 37/32* (2006.01)
(52) U.S. Cl.
CPC .. *H01J 37/32715* (2013.01); *H01J 37/32449* (2013.01); *H01J 37/32642* (2013.01);
(Continued)

(58) Field of Classification Search
CPC ........... H01L 21/67253; H01L 21/6831; H01L 21/6833; H01L 21/68714; H01L 21/6875;
(Continued)

(56) References Cited

U.S. PATENT DOCUMENTS

2005/0087821 A1* 4/2005 Bojarczuk ............ H10D 64/691
257/410
2015/0332951 A1 11/2015 Male et al.
(Continued)

FOREIGN PATENT DOCUMENTS

CN 101226871 A 7/2008
CN 101226871 B * 7/2010
(Continued)

OTHER PUBLICATIONS

The World Intellectual Property Organization (WIPO) International Search Report for PCT/CN2021/079473 May 26, 2021 7 Pages (including translation).

*Primary Examiner* — Edward Chin
(74) *Attorney, Agent, or Firm* — ANOVA LAW GROUP, PLLC (57) ABSTRACT The present disclosure discloses a carrier device, a semiconductor apparatus, and a residual charge detection method. The disclosed carrier device is configured to carry a wafer in a semiconductor apparatus. The carrier device includes an electrostatic carrier plate and at least three positioning members, wherein the electrostatic carrier plate includes a carrying surface configured to carry the wafer; the at least three positioning members are arranged around the carrying surface at intervals along a circumferential direction of the carrying surface, each positioning member is provided with a position limiting segment, and the at least three position limiting segments form a position limiting space above the carrying surface. An opening size of the position limiting space increases along a direction away (Continued)

from the carrying surface. The above-mentioned solution can solve the problem that a position deviation of the wafer is relatively large due to incomplete charge removal of the wafer.

17 Claims, 9 Drawing Sheets

(52) U.S. Cl.
CPC ... *H01J 37/32816* (2013.01); *H01J 2237/182* (2013.01); *H01J 2237/2007* (2013.01); *H01J 2237/20235* (2013.01); *H01J 2237/24564* (2013.01); *H01J 2237/334* (2013.01)

(58) Field of Classification Search
CPC ............... H01L 21/68785; H01L 22/10; H01J 2237/182; H01J 2237/2007; H01J 2237/20235; H01J 2237/24564; H01J 2237/334; H01J 37/32449; H01J 37/32642; H01J 37/32715; H01J 37/32816
See application file for complete search history.

(56) References Cited

U.S. PATENT DOCUMENTS

| | | | | |
|---|---|---|---|---|
| 2016/0343823 A1* | 11/2016 | Akram | ................... | H10D 30/66 |
| 2017/0117170 A1* | 4/2017 | Wong | ................ | H01L 21/67369 |
| 2018/0337273 A1* | 11/2018 | Losee | ................... | H10D 62/393 |
| 2019/0348315 A1 | 11/2019 | Tanikawa | | |

FOREIGN PATENT DOCUMENTS

| | | | | | |
|---|---|---|---|---|---|
| CN | 101872733 | A | | 10/2010 | |
| CN | 208848877 | U | | 5/2019 | |
| CN | 111341719 | A | | 6/2020 | |
| JP | 05343506 | A | * | 12/1993 | |
| JP | 2008205313 | A | * | 9/2008 | |
| JP | 2009187990 | A | * | 8/2009 | ....... H01L 21/68728 |
| JP | 7122864 | B2 | * | 8/2022 | ............... B08B 5/02 |
| KR | 20110080811 | A | * | 7/2011 | |
| TW | 201622057 | A | | 6/2016 | |
| WO | 2011112812 | A2 | | 9/2011 | |

* cited by examiner

CARRIER DEVICE, SEMICONDUCTOR APPARATUS, AND RESIDUAL CHARGE DETECTION METHOD

CROSS-REFERENCES TO RELATED APPLICATIONS

This application is a continuation of International Application No. PCT/CN2021/079473, filed on Mar. 8, 2021, which claims priority to Chinese Application No. 202010192003.5 filed on Mar. 18, 2020, the entire content of all of which are incorporated herein by reference.

TECHNICAL FIELD

The present disclosure generally relates to the semiconductor manufacturing technology field and, more particularly, to a carrier device, a semiconductor apparatus, a residual charge detection method.

BACKGROUND

The manufacturing of a microelectronic device includes many different stages. Each stage includes many different processes. Etching is one of the important processes. An etching process mainly includes introducing a plasma to a surface of a wafer (to-be-etched material, such as silicon). The surface of the wafer is corroded by physical and chemical effects to form various lines, holes, trenches, or other shapes required on the wafer.

Currently, the electrostatic chuck is usually configured to adsorb the wafer. However, when the adsorption is released, residual charges often exist on the wafer, which generates a local adsorption effect with residual charges on the electrostatic chuck to cause a phenomenon of wafer position deviation or adherence when the wafer is lifted by a thimble. Thus, after each wafer is processed, a charge removal operation needs to be performed on the wafer. The general charge removal operation includes applying a reverse voltage to an electrode in the semiconductor apparatus, introducing gas and performing ignition, or both. After the charge removal operation is complete, the thimble of the semiconductor apparatus lifts the wafer. However, in the above-mentioned charge removal process, charges are not completely removed from the wafer, which causes the position of the wafer to have a relatively large deviation and eventually affects the normal fetching of the wafer.

SUMMARY

The disclosure discloses a carrier device, a semiconductor apparatus, and a residual charge detection method, which are used to solve the problem of a large position deviation of a wafer caused by incomplete charge removal of the wafer.

In order to solve the above problems, embodiments of the present disclosure provide a carrier device configured to carry a wafer in a semiconductor apparatus. the carrier device includes an electrostatic carrier plate and at least three positioning members. The electrostatic carrier plate includes a carrying surface configured to carry the wafer. The at least three positioning members are arranged around the carrying surface at intervals along a circumferential direction of the carrying surface. Each of the positioning members is provided with a position limiting segment. The at least three position limiting segments form a position limiting space above the carrying surface. An opening size of the position limiting space increases along a direction away from the carrying surface.

In some embodiments, the position limiting segment includes a rod body. An inclined surface is formed on an outer peripheral wall of the rod body, or the position limiting segment is a conical segment.

In some embodiments, the at least three positioning members are able to ascend or descend to cause the at least three position limiting segments to be at a first position that is protruding from the carrying surface, or at a second position below the carrying surface.

In some embodiments, the carrier device further includes an annular base. The annular base is arranged around the carrying surface. The annular base is provided with at least three mounting holes. The at least three positioning members are mounted in the mounting holes in a one-to-one correspondence and are able to ascend and descend relative to the annular base.

In some embodiments, the annular base includes a base ring and a focus ring. The focus ring is arranged on the base ring. The focus ring includes an annular protrusion protruding from the carrying surface. When the position limiting segment is at the first position, a radial distance between an inner peripheral wall of the annular protrusion and an edge of the carrying surface is greater than a radial distance between an inner sidewall of the position limiting segment and the edge of the carrying surface.

In some embodiments, the electrostatic carrier plate includes at least three thimbles and an electrostatic chuck. The at least three thimbles are retractably arranged in the electrostatic chuck and are arranged at intervals along a circumferential direction of the electrostatic chuck. The at least three thimbles are able to lift the wafer to a wafer pick-and-place position. When the wafer is in wafer the pick-and-place position, on a vertical cross-section perpendicular to the carrying surface, an orthographic projection of the inner sidewall of the position limiting segment has a radial direction between a position at a same height as a lower edge of the wafer and the lower edge of the wafer. The radial distance is less than a predetermined warning value.

In some embodiments, the carrier device further includes a drive mechanism. The at least three positioning members are all connected to the driving mechanism. The drive mechanism is configured to drive the at least three position limiting segments to ascend and descend synchronously.

In some embodiments, the drive mechanism includes an ascending and descending drive source, a transmitter, and at least three vacuum bellows. One end of each of the vacuum bellows is connected to each of the positioning members in a one-to-one correspondence. The vacuum bellows are sealed with and connected to the bottom of the electrostatic carrier plate to seal the mounting holes. The other end of each of the vacuum bellows is connected to a first end of the transmitter. A second end of the transmitter is connected to the ascending and descending drive source.

In some embodiments, the ascending and descending drive source includes a linear motor or a hydraulic extension and retraction rod.

In some embodiments, the mounting holes are circular holes. The positioning members are cylindrical rods. The diameters of the circular holes are larger than the diameters of the cylindrical rods, and a difference between a diameter of a mounting hole and a diameter of a cylindrical rod ranges from 0.5 mm to 2 mm.

In some embodiments, the positioning members are resin members.

In some embodiments, the at least three positioning members are evenly distributed along the circumferential direction of the carrying surface.

As another technical solution, embodiments of the present disclosure provide a semiconductor apparatus, including a reaction chamber. The reaction chamber is provided with the carrier device.

As another technical solution, embodiments of the present disclosure provide a residual charge detection method applicable to the semiconductor apparatus. The method includes the following steps:

at S110, introducing a process gas into the reaction chamber of the semiconductor apparatus, and turning on a power supply of an upper electrode to perform plasma ignition;

at S120, after the ignition is completed, applying a reverse voltage to the electrostatic carrier plate to remove residual charges on the wafer;

at S130, turning on a back blowing gas control device to introduce back blowing gas between the carrying surface and the wafer;

at S140, detecting a current flow rate of the back blowing gas when a back blowing pressure between the carrying surface and the wafer is a predetermined pressure; and at S150, comparing the current flow rate with a predetermined flow rate range, and determining whether the residual charges still exist on the wafer according to a comparison result.

In some embodiments, step S150 includes:

if the current flow rate is greater than or equal to an upper limit of the predetermined flow rate range, determining that no residual charge exists on the wafer; and if the current flow rate is less than the upper limit of the predetermined flow rate range, determining that the residual charges exist on the wafer.

In some embodiments, if the current flow rate is less than the upper limit of the predetermined flow range and is greater than or equal to a lower limit of the predetermined flow range, the method returns to step S130, and the back blowing pressure is adjusted to 1.5 to 2.5 times of the predetermined pressure, and after a predetermined duration, the back blowing pressure is restored to the predetermined pressure, and step S140 is performed.

In some embodiments, if the current flow rate is less than the lower limit of the predetermined flow rate range, the method returns to step S110.

The technical solution adopted in the present disclosure may achieve the following beneficial effects.

In the carrier device disclosed in embodiments of the present disclosure, the electrostatic carrier plate includes a carrying surface configured to support the wafer. The at least three positioning members are arranged around the carrying surface at intervals along the circumferential direction of the carrying surface. Each positioning member is provided with a position limiting segment. The position limiting segments of the at least three positioning members can form the position limiting space above the carrying surface. The size of the opening of the position limiting space increases in a direction away from the carrying surface. The position limiting space can limit the wafer during the process of fetching and placing the wafer to self-correct the position of the wafer when the position of the wafer is shifted due to the incomplete charge removal. Thus, the position deviation of the wafer may be always controlled within a small range to avoid the problem that the wafer is difficult to be or cannot be smoothly fetched from the reaction chamber of the semiconductor apparatus because the position deviation of the wafer is too large.

In the semiconductor apparatus disclosed in embodiments of the present disclosure, by using the above-mentioned carrier device disclosed in embodiments of the present disclosure, the position deviation of the wafer can always be controlled within a small range to avoid the problem that the wafer is difficult to be or cannot be smoothly fetched from the reaction chamber of the semiconductor apparatus because the position deviation of the wafer is too large. The residual charge detection method disclosed in embodiments of the present disclosure is applicable to the above-mentioned semiconductor apparatus disclosed in embodiments of the present disclosure. First, the residual charge on the wafer is removed by performing the plasma ignition and applying the reverse voltage to the electrostatic carrier plate. Then, the back blowing gas control device is configured to introduce the back blowing gas between the carrying surface and the wafer to further remove the residual charge on the wafer. Then, the current flow rate is detected when the back blowing pressure of the back blowing gas between the carrying surface and the wafer is the predetermined pressure. The current flow rate is compared with the predetermined flow rate range. Whether the residual charges still exist on the wafer is determined according to the comparison result. Thus, the residual charge removal effect of the wafer is determined, and whether the residual charge removal needs to be performed on the wafer again is determined according to the determination.

BRIEF DESCRIPTION OF THE DRAWINGS

In order to more clearly illustrate the technical solutions in the embodiments of the present invention or the background technology, the following briefly introduces the accompanying drawings that need to be used in the embodiments or the background technology. On the premise of no creative labor, other drawings can also be obtained from these drawings.

REFERENCE NUMERALS

100 Annular base, 110 Mounting hole, 120 Base ring, 130 f ring, 131 Annular protrusion, 131a an inner peripheral wall of annular protrusion 200 Electrostatic carrier plate, 210 Carrying surface of electrostatic carrier plate, 220 Thimble, 230 Electrostatic chuck;

300 Positioning member, 310 Position limiting segment, 311 Inclined surface; 400 Wafer;

500 Drive mechanism, 510 Ascending and descending drive source, 520 Transmitter, 521 First segment of transmitter, 522 Second segment of transmitter, 530 Vacuum bellows, 531 Sealed groove, 532 Lift shaft, 533 Bellows.

DETAILED DESCRIPTION OF THE EMBODIMENTS

In order to make the objectives, technical solutions, and advantages of the present disclosure clearer, the technical solutions of the present disclosure will be clearly and completely described below with reference to specific embodiments of the present disclosure and the corresponding drawings. Obviously, the described embodiments are only some, but not all, embodiments of the present disclosure. Based on embodiments of the present disclosure, all other embodiments obtained by those of ordinary skill in the art without creative efforts shall fall within the protection scope of the present disclosure.

The technical solutions disclosed by embodiments of the present disclosure are described in detail below with reference to the accompanying drawings.

First Embodiment

Figure 1:
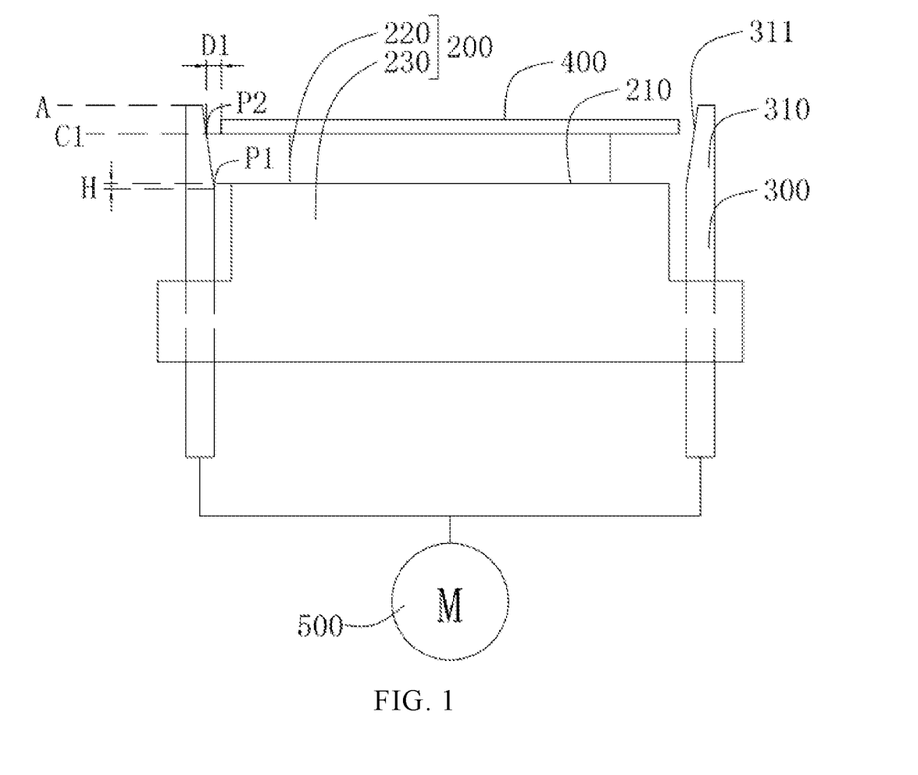
FIG. 1 is a schematic structural diagram showing a carrier device when a wafer is at a pick-and-place position according to a first embodiment of the present disclosure.
Figure 2:
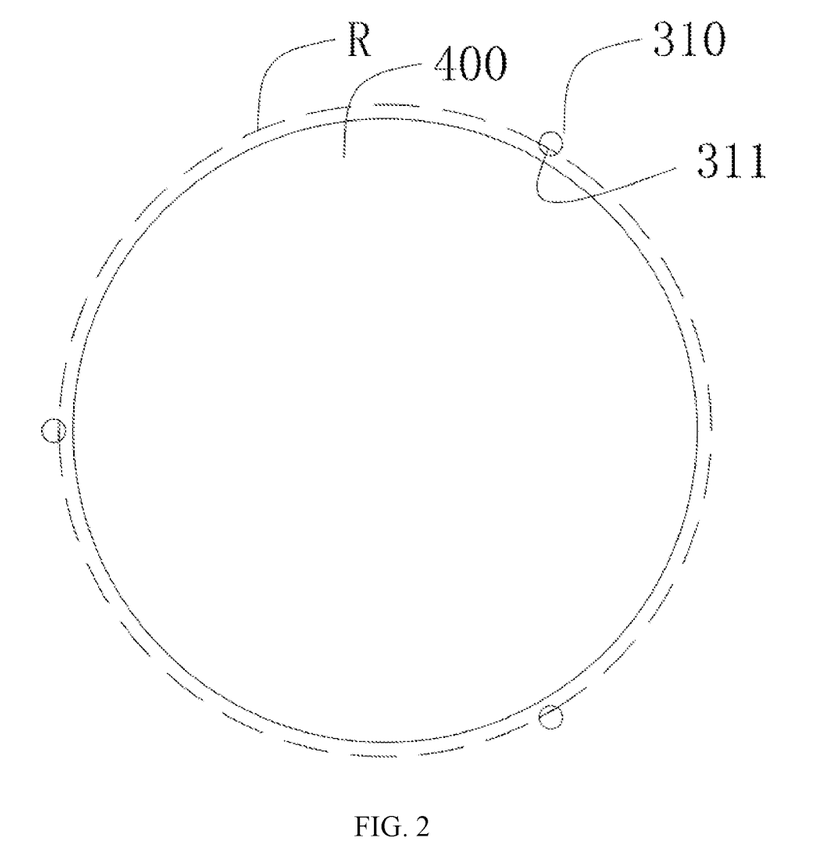
FIG. 2 is a schematic diagram showing a position relationship of a position limiting segment and a wafer according to the first embodiment of the present disclosure.
Figure 3:
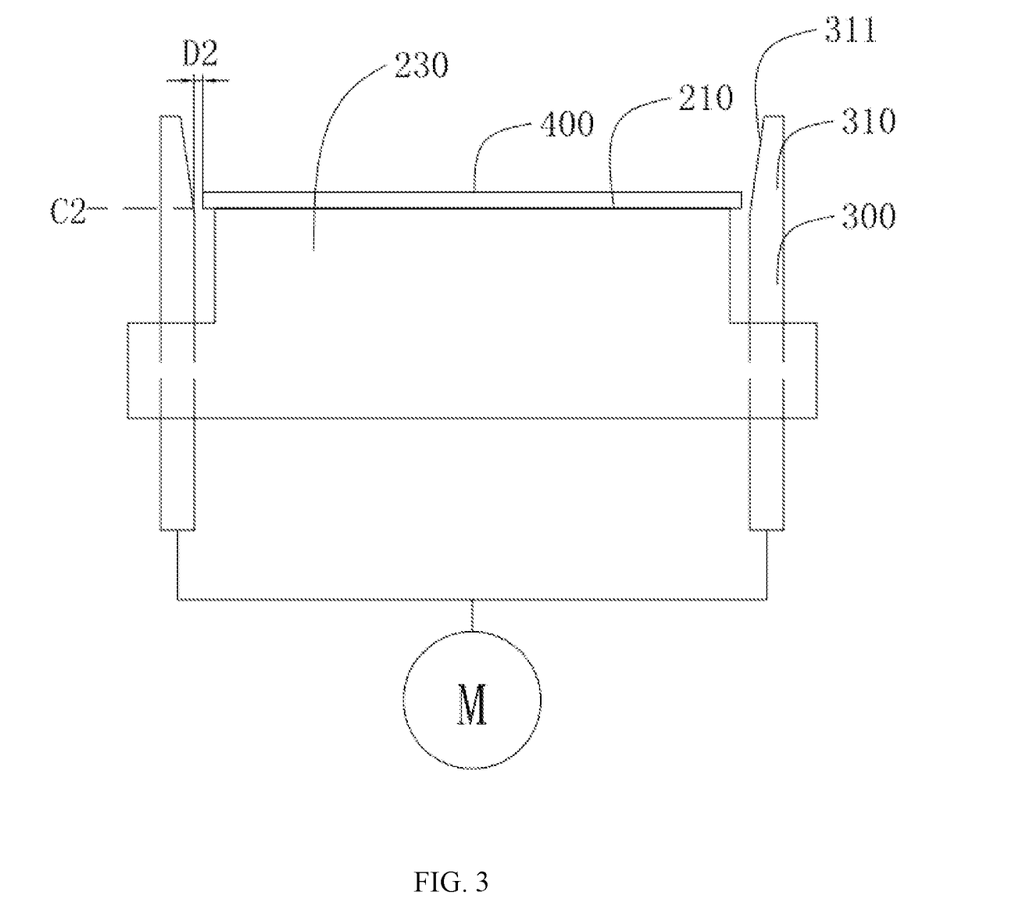
FIG. 3 is a schematic structural diagram showing a carrier device when a wafer is on a carrying surface according to the first embodiment of the present disclosure.

With reference to FIG. 1 to FIG. 3, the first embodiment of the present disclosure provides a carrier device. The disclosed carrier device may be configured to carry a wafer 400 in a semiconductor apparatus. The carrier device includes an electrostatic carrier plate 200 and at least three positioning members 300 (only two positioning members 300 are shown in FIG. 1 and FIG. 3). The electrostatic carrier plate 200 includes a carrying surface 210 configured to carry a wafer 400. At least three positioning members 300 may be arranged along a circumferential direction of the carrying surface 210 at intervals around the carrying surface 210. Each positioning member 300 is provided with a position limiting segment 310. The position limiting segment 310 may be connected to the positioning member 300 in various manners. For example, in the present embodiment, the position limiting segment 310 and the positioning member 300 may be in an integral structure. The positioning member 300 may be connected to an end of the position limiting segment 310 with a relatively large cross-section that is parallel to the carrying surface 210. Of course, in practical applications, the positioning limiting segment 310 and the positioning member 300 may also be connected in other non-detachable manners such as welding or in a detachable connection manner.

Moreover, at least three position limiting segments 310 may form a position limiting space above the carrying surface 210. A size of an opening of the position limiting space may increase in a direction away from the carrying surface 210. For example, if the carrier device is mounted at the semiconductor apparatus, an opening direction of the position limiting space (i.e., the direction away from the carrying surface 210) may face a top of a reaction chamber of the semiconductor apparatus. Specifically, each position limiting segment 310 may have various structures capable of forming the aforementioned position limiting space. For example, in the present embodiment, as shown in FIG. 2, the position limiting segment 310 includes a rod body. An inclined surface 311 may be formed at an outer peripheral wall of the rod body. The inclined surface 311 may be, for example, formed by cutting the rod body inclinedly from an upper end surface. The rod body may be, for example, a cylinder or in any other shape.

As shown in FIG. 2, the inclined surfaces 311 of the at least three position limiting segments 310 are located at the position where the cross-section area of the position limiting segment 310 is the largest, which corresponds to the largest opening of the formed position limiting space. The size of the largest opening is the diameter of circle R shown in FIG. 2.

In addition, in order to facilitate processing, a shape of the positioning member 300 may be the same as the shape of the rod body. In other words, the rod body and the positioning member 300 may be an upper portion and a lower portion of a rod-shaped member, respectively, and both the rod body and the positioning member 300 have the same size. Of course, in practical applications, the shape of the positioning member 300 may also be different from the shape of the above-mentioned rod body. The structures of the rod body and the positioning member 300 are not limited in embodiments of the present disclosure.

The positioning member 300 may be made of various materials, such as plastic, metal, etc., which is not limited by embodiments of the present disclosure. Optionally, the positioning member 300 may be a resin member, because the positioning member 300 made of resin material may not spark or be difficult to spark during the processing of the wafer 400, which affects the processing of the wafer 400 and the reliability of the carrier device. Thus, the stability and reliability of the semiconductor apparatus may be improved during the processing of the wafer 400.

It should be noted that the structure of each position limiting segment 310 that forms the aforementioned position limiting space may be not limited to the aforementioned structure. For example, the aforementioned position limiting segment 310 may also be a conical segment. For example, the conical segment may be a truncated cone. The above-mentioned position limiting space may also be formed. In practical applications, a shape of the cross-section of the above-mentioned conical segment that is parallel to the carrying surface 210 may be a circle, a polygon, or any other shape.

Optionally, if the above-mentioned positioning limiting segment 310 includes the rod body formed with the inclined surface 311. A distance between the largest cross-section of the position limiting segment 310 and the smallest cross-section of the position limiting segment 310 may range from 6 mm to 20 mm in a vertical direction perpendicular to the carrying surface 210. If the position limiting segment 310 is a conical segment, the distance from a conical top and a conical bottom of the conical segment may range from 6 mm to 20 mm in the vertical direction perpendicular to the carrying surface 210.

Optionally, if the above-mentioned position limiting segment 310 includes a rod body formed with the inclined surface 311, an included angle between the inclined surface 311 and the vertical direction perpendicular to the carrying surface 210 may range from 5° to 15°. If the position limiting section 310 is a conical segment, an inclined angle of the outer peripheral wall of the conical segment may range from 5° to 15°.

By taking the above-mentioned position limiting segment 310 including the rod body formed with the inclined surface 311 as an example, as shown in FIG. 1, the position where the cross-section of the position limiting segment 310 is the smallest is P1. Optionally, position P1 may be lower than the carrying surface 210. That is, position P1 and the carrying surface 210 may have a distance H, which can ensure that the inclined surface 311 may cover the space above the carrying surface 210.

In an optional embodiment, the at least three positioning members 300 can be ascended and descended. Thus, the at least three position limiting segments 310 can be located at a first position protruding from the carrying surface 210. For example, as shown in FIG. 1, when an upper end surface of the position limiting segment 310 is at position A, the position where the position limiting segment 310 is located is the first position or the second position below the carrying surface 210.

In general, in the automated production process of the wafer 400, the wafer 400 is usually fetched by a manipulator. In order to realize the fetch action by fingers of the manipulator, many parts may be mounted in the fingers, such as a chucks, a position sensor, a proximity sensor, a finger patch, etc. Therefore, the fingers of the manipulator may interfere with the position limiting segment 310 protruding from the carrying surface 210, which may cause a gripper or the position limiting segment 310 to be damaged, thereby causing a production accident. In this case, before the manipulator extends into the process chamber of the semiconductor apparatus to perform the pick-and-place operation, the positioning member 300 may need to be lowered so that the position limiting segment 310 is located below the carrying surface 210 to prevent the fingers of the manipulator from interfering the position limiting segment 310 when fetching or placing the wafer 400. Thus, the fingers of the manipulator or the position limiting segment 310 may be prevented from being damaged to avoid a production accident. Thus, the stability of the automatic manufacturing of the wafer 400 may be eventually improved.

In an optional embodiment, the carrier device may further include a drive mechanism 500. At least three positioning members 300 may be connected to the driving mechanism 500. The driving mechanism 500 may be configured to drive the at least three positioning members 300 to ascend and descend synchronously. Thus, the automatic ascending ad descending movement of the position limiting segment 310 may be realized, and an automation degree of the carrier device may be improved.

It should be noted that, in practical applications, for different applications, the position limiting segment 310 may also be selected to be fixed at the position protruding from the carrying surface 210.

The wafer 400 may be generally processed by the semi-conductor apparatus (e.g., an etching machine, etc.). During a specific working process of the semiconductor apparatus, after the wafer 400 is transferred to the reaction chamber of the semiconductor apparatus, the wafer 400 may need to descend from a high position (i.e., wafer pick-and-place position C1 shown in FIG. 1) to the carrying surface 210. That is, the wafer 400 may descend to process position C2 shown in FIG. 3. In a descending process, with the position limiting space formed by the at least three position limiting segments 310, a position limiting function may be performed on the wafer 400. Thus, the wafer 400 may descend to a predetermined position of the carrying surface 210. Even if the wafer 400 has a position deviation, the position limiting space may also perform the correction on the position of the wafer 400. After the wafer 400 is processed, the wafer 400 may need to ascend from the carrying surface 210 to a high position, that is, the wafer pick-and-place position C1. In the ascending process, the position of the wafer 400 may deviate because the charges of the wafer are not completely removed. With the position limiting space formed by the at least three position limiting segments 310, the position of the wafer may be limited, thereby realizing the self-correction on the position of the wafer 400. Thus, the position deviation of the wafer 400 may be controlled within a relatively small range. Thus, the problem that the wafer 400 is difficult or cannot be fetched from the reaction chamber of the semiconductor apparatus due to a large position deviation of the wafer 400 may be avoided.

In order to cause the above-mentioned wafer 400 to ascend and descend relative to the carrying surface 210 to cooperate with the manipulator to realize the wafer pick-and-place operation, as shown in FIG. 1, the above-mentioned electrostatic carrying plate 200 includes at least three thimbles 220 (only two thimbles are shown in FIG. 1) and the electrostatic chuck 230. The at least three thimbles 220 may be arranged in the electrostatic chuck 230 in a liftable manner and arranged along the circumferential direction of the electrostatic chuck 230 at intervals. The at least three thimbles 220 may lift the wafer 400 up to a high position (i.e., the pick-and-place position C1 shown in FIG. 1) or cause the wafer 400 to descend from the high position to a position below the carrying surface 210. Thus, the wafer 400 may move onto the carrying surface 210 (i.e., process position C2 shown in FIG. 3).

Optionally, as shown in FIG. 1, when the wafer 400 is located at the above-mentioned pick-and-place position C1, on a vertical cross-section perpendicular to the carrying surface 210, an orthographic projection of an inner sidewall of the position limiting segment 310 (e.g., the inclined surface 311) is at a same height position as a lower edge of the wafer 400 (i.e., position P2 on the inclined surface 311) and have a radial distance with the lower edge of the wafer 400. That is, the edge of the wafer 400 and the above position P2 may have radial distance D1. The radial distance D1 may satisfy that the position deviation of the wafer 400 is always controlled within a small range. For example, the difference may be smaller than a predetermined warning value.

The above-mentioned predetermined warning value may be a fetching out warning value of the wafer 400. That is, the fetching out warning value of the wafer 400 may be an alarm value of the manipulator in the present embodiment. Specifically, the manipulator may have a certain self-calibration function. When the deviation of the wafer 400 is smaller than a calibration range of the manipulator, the manipulator can fetch the wafer 400 through its own calibration function. When the deviation of the wafer 400 is larger than the calibration range of the manipulator, an alarm may occur, and the production may be suspended. In order to ensure the stability of production volume, the alarm value of the manipulator may be generally set to be less than a maximum correction value of the manipulator.

Of course, when the semiconductor apparatus fetches the wafer in another manner, the fetching out warning value of the wafer 400 may maximum deviation of the wafer 400 allowed by the manner.

In addition, as shown in FIG. 3, when the wafer 400 is located on the carrying surface 210, that is, at process position C2 shown in FIG. 3, a radial distance D2 exists between the edge of the wafer 400 and the inclined surface 311 of the position limiting segment 310. Thus, the wafer 400 may not be in contact with the position limiting segment 310 to avoid damage caused by the contact between the wafer 400 and the position limiting segment 310.

The structures and functions of the electrostatic chuck 230 and the thimble 220 described above are all known technologies and are not repeated here for brevity of the specification.

Second Embodiment

Figure 4:
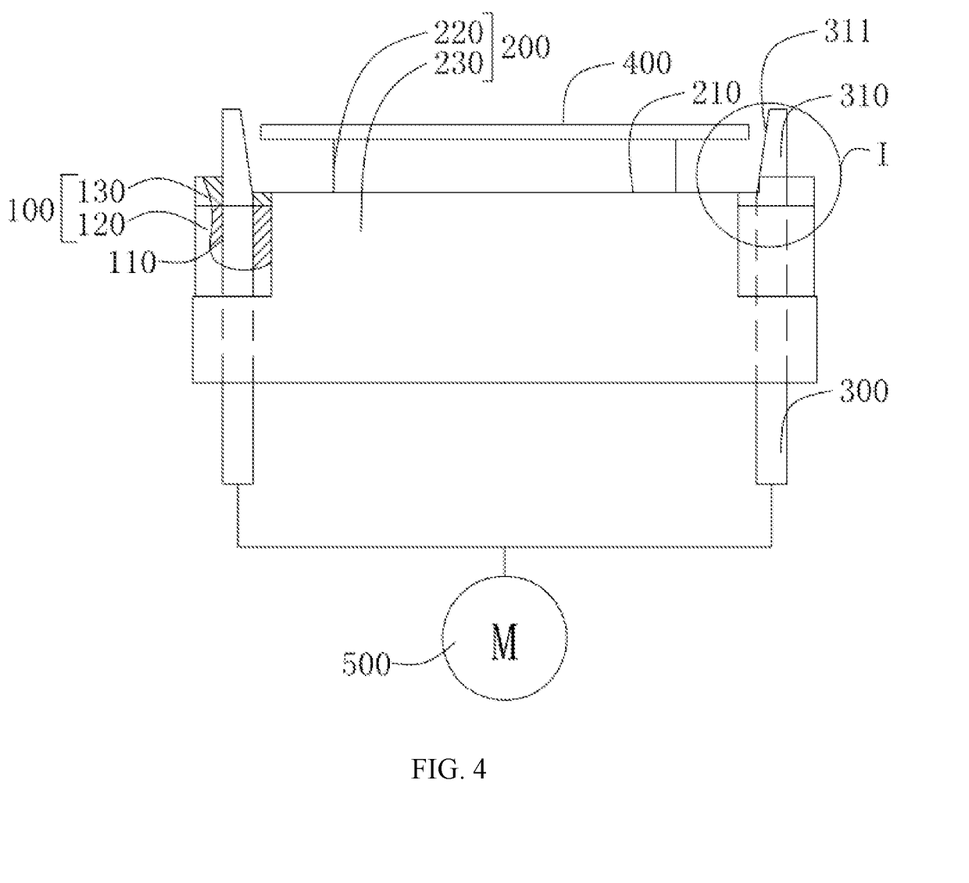
FIG. 4 is a schematic structural diagram of a carrier device according to a second embodiment of the present disclosure.

With reference to FIG. 4, a second embodiment of the present disclosure discloses a carrier device, which is an improvement made based on the above-mentioned first embodiment. Specifically, based on the above-mentioned first embodiment, the carrier device further includes an annular base 100, which is configured to be used as a member for placing the wafer 400 of the semiconductor apparatus together with the above-mentioned electrostatic carrier plate 200. The annular base 100 may be arranged around the carrying surface 210. At least three mounting holes 110 may be arranged at the annular base 100. The at least three positioning members 300 may be mounted in the mounting holes 110 in a one-to-one correspondence and may ascend or descend relative to the annular base 100. By arranging at least three mounting holes 110 at the annular base 100, the position limiting segments 310 may be retracted into the mounting holes 110 or at least partially extended out of the mounting holes 110.

In an optional embodiment, the mounting holes 110 may be circular holes. The positioning member 300 may be a cylindrical rod. A diameter of a circular hole may be larger than a diameter of a cylindrical rod. A difference between the diameter of the circular hole and the diameter of the cylindrical rod may range from 0.5 mm to 2 mm. Within this value range, the mounting hole 110 may be prevented from being opened too large. Thus, the plasma may accumulate in the mounting hole 110 during the process of processing the wafer 400. Meanwhile, the opening of the mounting hole 110 may be prevented from being opened small, which causes the positioning member 300 to be difficult to move up and down.

Figure 5:
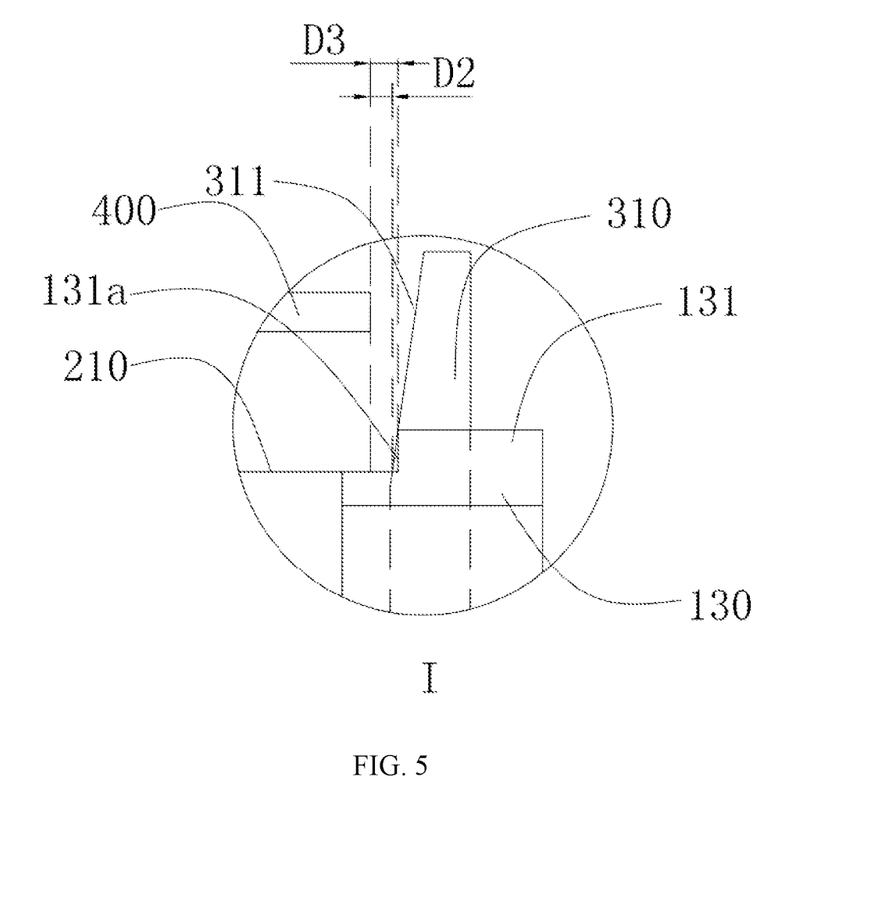
FIG. 5 is a schematic enlarged diagram showing area I in FIG. 4.

In an optional embodiment, the above-mentioned annular base 100 may include a base ring 120 and a focus ring 130. As shown in FIG. 5, the focus ring 130 is arranged at the base ring 120. The focus ring 130 may include an annular protrusion member 131 protruding from the carrying surface 210. Moreover, when the position limiting segment 310 is located at the first position shown in FIG. 5 (the same as the position where the position limiting segment 310 is located in FIG. 1), on the vertical cross-section perpendicular to the carrying surface 210, an orthographic projection of an inner peripheral wall 131a of the annular protrusion member 131 may be located outside of an orthographic projection of an inner sidewall (i.e., the inclined surface 311) of the position limiting segment 310. Specifically, the inner peripheral wall 131a of the annular protrusion member 131 and the edge of the wafer 400 (i.e., the edge of the carrying surface 210 that has the same shape and size as the edge of the wafer 400) may have a radial distance D3. The inner sidewall (i.e., the inclined surface 311) of the position limiting segment 310 and the edge of the wafer 400 (i.e., the edge of the aforementioned carrying surface 210) may have a radial distance D2. Radial distance D3 may be greater than radial distance D2. Thus, while a correction is performed on the position of the wafer 400, the wafer 400 may not be in contact with the inner peripheral surface 131a of the focus ring 130, which prevents the focus ring 130 from being damaged to improve the yield of the wafer 400.

The other structures and functions of the above-mentioned base ring 120 and the focus ring 130 are all known technologies and are not repeated here for the brevity of the specification.

In addition, the semiconductor apparatus configured to process the wafer 400 may generally include the reaction chamber. The annular base 100, the electrostatic carrier plate 200, and the at least three positioning members 300 may be arranged in the reaction chamber.

Figure 6:
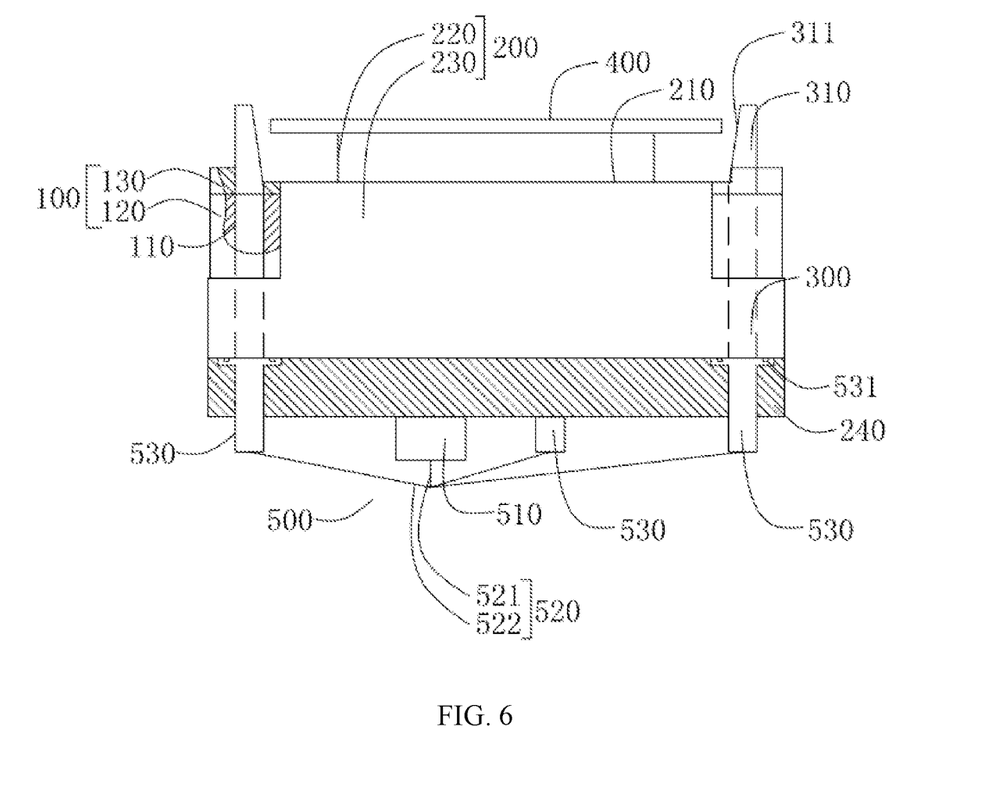
FIG. 6 is a schematic structural diagram of a carrier device according to a third embodiment of the present disclosure.

Further, a number of the drive mechanisms 500 may be the same as a number of the positioning members 300. Each positioning member 300 may be connected to a drive mechanism 500. However, in such a manner, a plurality of drive mechanisms 500 may need to be included, which causes the high cost of the carrier device and is not beneficial to control the at least three positioning members 300 to be extended or retracted synchronously. Based on this, in an optional embodiment, as shown in FIG. 6, the drive mechanism 500 includes an ascending and descending drive source 510, a transmitter 520, and at least three vacuum bellows 530 (only two positioning members 300 are shown in FIG. 6). An end of each vacuum bellows 530 may be connected to each positioning member 300 in a one-to-one correspondence. Each vacuum bellows 530 may be sealed and connected to the bottom of the electrostatic carrier plate 200 (e.g., an apparatus plate 240 arranged at the bottom of the electrostatic chuck 230) and configured to seal each of the mounting holes 110. The other end of each bellows 530 may be connected to the first end of the transmitter 520. The second end of the transmitter 520 may be connected to the ascending and descending drive source 510. In such a connection manner, the structure may be relatively simple, and the driving may be reliable, which facilitates installation performed by an installation crew. Meanwhile, compared with the above-mentioned connection manner of the plurality of drive mechanisms, in this connection manner, only one drive mechanism 500 may be needed to drive the plurality of positioning members 300. Thus, the cost of the carrier device may be reduced, and the at least three positioning members 300 may be conveniently controlled to ascend and descend synchronously.

Specifically, a plurality of types of ascending and descending drive sources 510 may be included, such as a linear motor, a hydraulic extension and retraction rod, and a pneumatic extension and retraction rod. The linear motor, the hydraulic extension and retraction rod, and the pneumatic extension and retraction rod may all provide linear power to drive the positioning member 300 to ascend and descend. The type of the ascending and descending drive source 510 may be not limited in embodiments of the present disclosure.

Figure 7:
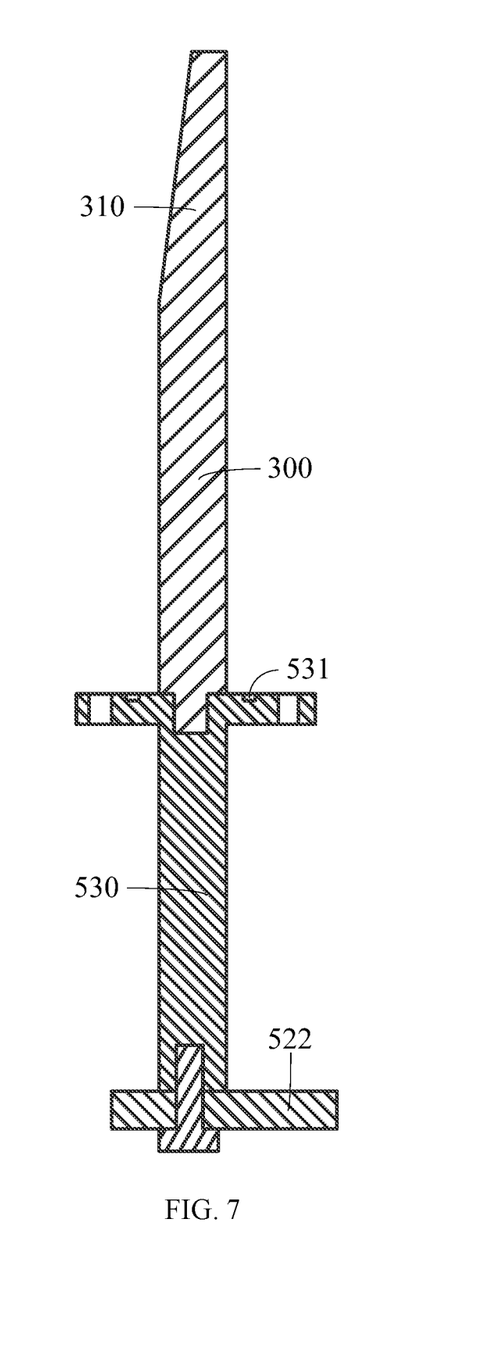
FIG. 7 is a schematic cross-sectional diagram showing a vacuum bellows according to the third embodiment of the present disclosure.

In a specific connection manner, as shown in FIG. 7, one end of the vacuum bellows 530 is connected to the positioning member 300 by threads. As shown in FIG. 6 and FIG. 7, the transmitter 520 includes a first segment 521 and a second segment 522. An end of the second segment 522 may be connected to an end of the first segment 521. The other end of the first segment 521 may be connected to the ascending and descending drive source 510. The other end of the second segment 522 may be connected to the other end of the vacuum bellows 530 by screws. The threaded connection manner may be easy to install, which facilitates the installation crew to perform installation job. After installation, the stability may be relatively good, and falling may be avoided. Meanwhile, in this solution, the components of the ascending and descending drive source 510, the transmitter 520, and the vacuum bellows 530 may be detachably connected with each other, which facilitates disassembly and maintenance in a later stage, and replacement of a damaged component, thereby improving the maintainability of the carrier device. Of course, the connection among the components may also be achieved by a snap connection and a magnetic connection.

As described above, the vacuum bellows 530 may be sealed with and connected to the bottom of the electrostatic carrier plate 200 (e.g., the apparatus plate 240 arranged at the bottom of the electrostatic chuck 230), which may be configured to seal the mounting holes 110. Optionally, as shown in FIG. 7, a sealing groove 531 is arranged at an end of the vacuum bellows 530 that is opposite to the electrostatic carrier plate 200. A seal ring is arranged in the sealing groove 531. The seal ring may be compressed after installation to cause the shape to deform to achieve an effect of sealing a gap to better seal the mounting hole 110. Thus, the vacuum system of the semiconductor apparatus may be prevented from being affected due to the mounting hole 110. Thus, the semiconductor apparatus may operate normally and stably.

Figure 8:
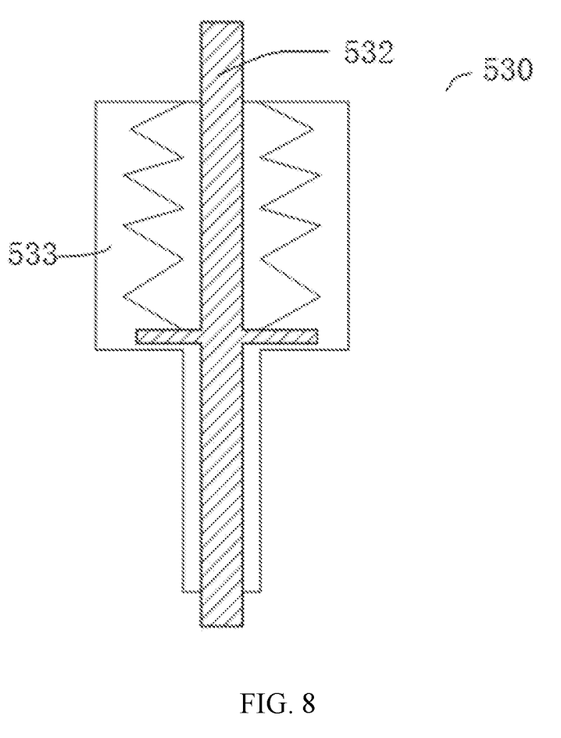
FIG. 8 is a schematic internal structural diagram of a vacuum bellows according to the third embodiment of the present disclosure.

In an optional embodiment, as shown in FIG. 8, the vacuum bellows 530 includes a lift shaft 532 and a bellows 533 sleeved around the lift shaft 532. An end of the lift shaft 532 may be threadedly connected to the positioning member 300. The other end may be connected to the transmitter 520. An end of the bellows 533 may be sealed with and connected to the bottom of the electrostatic carrier plate 200 (e.g., the apparatus plate 240 arranged at the bottom of the electrostatic chuck 230). The other end may be sealed with and connected to the lift shaft 532 through a flange. The bellows 533 may be retractable to accommodate the ascending and descending motion of the lift shaft 532.

It should be noted that other structures and principles of the vacuum bellows 530 are known technologies and are not repeated here for the brevity of the specification.

In summary, in the carrier device disclosed in the above-mentioned embodiments of the present disclosure, the electrostatic carrier plate may include a carrying surface configured to support the wafer. The at least three positioning members may be arranged around the carrying surface at intervals along the circumferential direction of the carrying surface. Each positioning member may be provided with a position limiting segment. The position limiting segments of at least three positioning members may form a position limiting space above the carrying surface. The size of the opening of the position limiting space may increase along the direction away from the carrying surface. The position limiting space may be configured to limit the position of the wafer during the process of fetching and placing the wafer to self-correct the position of the wafer when the position of the wafer is deviated due to incomplete charge removal. Thus, the deviation of the position of the wafer may be controlled within a relatively small range, which avoids the problem that the wafer may be difficult to be or cannot be fetched out from the reaction chamber of the semiconductor apparatus smoothly because the position deviation of the wafer may be too big.

Based on the carrier device disclosed in the above embodiments of the present disclosure, the present disclosure further provides a semiconductor apparatus. The disclosed semiconductor apparatus may include the reaction chamber. The carrier device of any of the above embodiments may be arranged in the reaction chamber.

In the semiconductor apparatus disclosed in embodiments of the present disclosure, by using the above-mentioned carrier device disclosed in embodiments of the present disclosure, the position deviation of the wafer may be always controlled within a relatively small range, which avoids the problem that the wafer may be difficult to be or cannot be fetched out from the reaction chamber of the semiconductor apparatus smoothly because the position deviation of the wafer may be too big.

Fourth Embodiment

Figure 9:
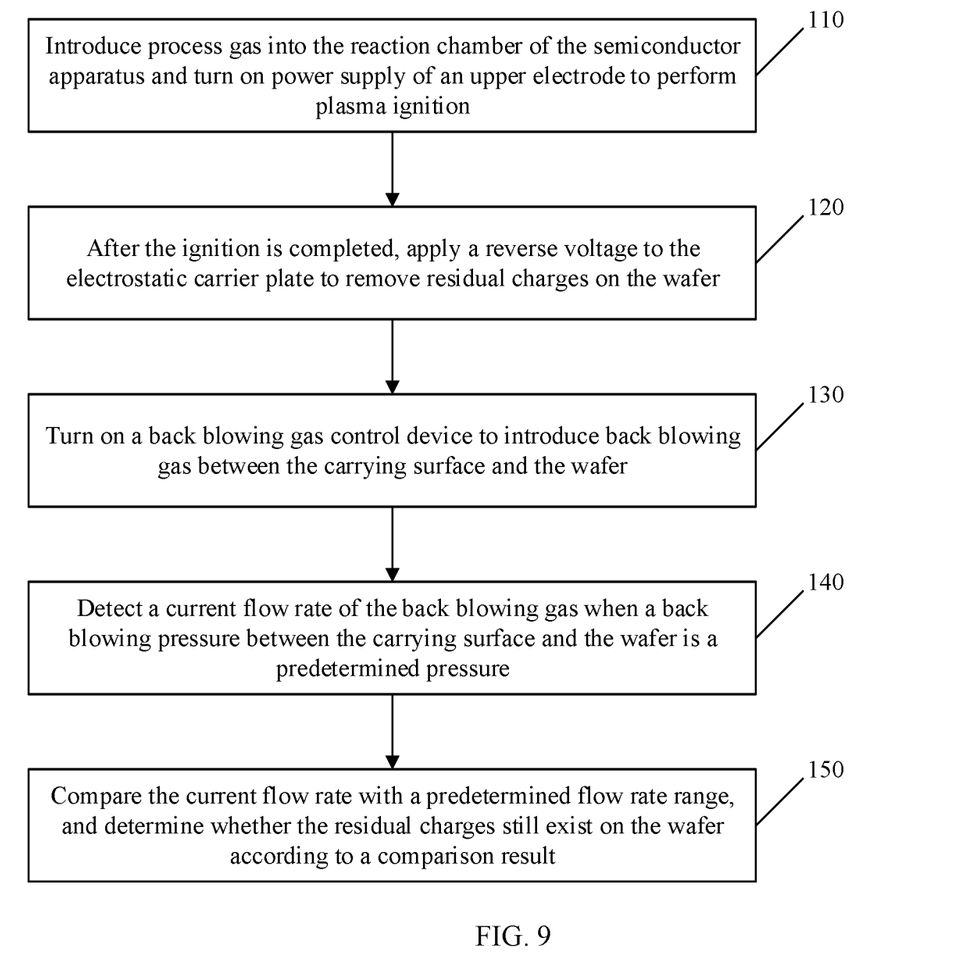
FIG. 9 is a schematic flow block diagram of a residual charge detection method according to a fourth embodiment of the present disclosure.

With reference to FIG. 9, the fourth embodiment of the present disclosure further provides a residual charge detection method, which is applicable to the above-mentioned semiconductor apparatus disclosed in the present disclosure. The detection method may be performed after an existing charge removal operation is performed on the wafer 400 or may also be performed after the wafer 400 is processed, that is, to replace the existing charge removal operation.

Specifically, taking the carrier device shown in FIG. 1 as an example, the method includes the following steps.

At S110, a process gas is introduced into the reaction chamber in the semiconductor apparatus, and the power supply of an upper electrode is turned on to perform plasma ignition.

At S120, a reverse voltage is applied to the electrostatic carrier plate 200 (i.e., the electrostatic chuck 230) after the ignition is completed to remove the residual charges on the wafer 400.

Specifically, by comparing the above two steps with the existing wafer charge removal method, the difference may include that duration of the initiation, an amplitude of the reverse voltage, and duration of the reverse voltage may be different. Further, in the step S110, the duration of the ignition may range from 1 s to 5 s. It should be noted that, in the semiconductor apparatus, the electrostatic carrier plate 200 (i.e., the electrostatic chuck 230) may be used as a lower electrode and electrically connected to a bias power supply. When the bias power supply is turned on, a bias voltage may be generated on the surface of the wafer 400. The bias voltage can attract the plasma in the process chamber to move toward the surface of the wafer 400 and react physically and chemically with the wafer 400 after arriving the surface of the wafer 400 to finish the processing of the wafer 400.

The portions that are not mentioned in the above two steps are the same as the existing wafer charge removal method. The charge removal principle are known technology and is not repeated here for brevity of the present specification.

At S130, the back blowing gas control device is turned on, and back blowing gas (e.g., helium gas) is introduced between the carrying surface 210 and the wafer 400.

At S140, a current flow rate is detected when of the back blowing pressure of the back blowing gas between the carrying surface 210 and the wafer 400 is a predetermined pressure.

At S150. Compare the current flow rate value with the preset flow rate range, and determine whether the residual charges still exist on the wafer 400 according to the comparison result.

The residual charge detection method disclosed in embodiments of the present disclosure may be applicable to the above-mentioned semiconductor apparatus disclosed in embodiments of the present disclosure. First, the residual charge on the wafer may be removed by using a manner of the plasma ignition and applying the reverse voltage to the electrostatic carrier plate. Then, the back blowing gas control device may be configured to introduce the back blowing gas between the carrying surface and the wafer to further remove the residual charge on the wafer. Then, by detecting the current flow rate when the back blowing pressure of the back blowing gas between the carrying surface and the wafer is the predetermined pressure, the current flow rate may be compared with the predetermined flow rate range. Whether the residual charge still exists on the wafer may be determined according to a comparison result. Thus, the effect of removing the wafer residual charge may be determined. Whether the wafer residual charge removal is needed to be performed again may be determined according to this.

Optionally, the above-mentioned predetermined flow rate range may be set in the following manner. When no residual charge exists on the wafer 400, that is, the wafer 400 is directly placed on the carrying surface 210, and the semiconductor apparatus does not perform any processing process, the back blow gas may be introduced between the carrying surface 210 and the wafer 400. The flow rate may be detected when the back flow pressure of the back flow gas between the carrying surface 210 and the wafer 400. The flow rate may be used as a standard flow rate. In this solution, N1 percentage of the standard flow rate may be used as an upper limit of the predetermined flow range, and N2 percentage N2 of the standard flow rate may be used as a lower limit of the predetermined flow rate range. For example, N1 percentage may be 90%, and N2 percent may be 60%. Of course, in practical applications, an appropriate predetermined flow rate range may also be selected in any other manner.

Based on this, above step S150 specifically includes:

If the above-mentioned current flow rate is greater than or equal to the upper limit of the above-mentioned predetermined flow rate range, no residual charge on the wafer may be determined. Specifically, since the above-mentioned current flow rate is relatively large, the wafer 400 may be represented to have relatively few or no residual charge, which has little impact on the wafer 400. Thus, the wafer may be considered to have no residual charge, and the subsequent wafer fetching operation may be directly performed.

If the current flow rate is less than the upper limit of the predetermined flow rate range, the wafer 400 may be determined to have the residual charge. Specifically, since the above-mentioned current flow rate is relatively small, the wafer 400 may be considered to have many residual charges, which may affect the wafer 400, the wafer fetching operation may not be performed directly, and the residual charge removal may need to be removed again. Optionally, an appropriate residual charge removal manner may be selected according to a comparison between the current flow rate and the lower limit of the predetermined flow rate range. Specifically, if the current flow rate is less than the upper limit of the predetermined flow rate range and greater than or equal to the lower limit of the predetermined flow rate, the process may return to above step S130. The back blowing pressure may be adjusted to be 1.5 to 2.5 times of the predetermined pressure. By increasing the back blowing pressure to 1.5 to 2.5 times of the predetermined pressure, the back blowing gas with a relatively high pressure may take away the residual charge through the flow. Compared with the existing charge removal operation, this charge removal manner is simple and easy to operate. However, this charge removal manner may be generally suitable for the case when the wafer 400 has a few charges.

After the predetermined duration of the above-mentioned back blowing process, the back blowing pressure may be restored to the predetermined pressure, and step S140 may be performed. Returning to step S140 may ensure that the wafer 400 may be detected under a same detection standard. Thus, the wafer 400 that is detected and removed with charges in this method may satisfy charge removal requirements.

If the current flow rate is less than the lower limit of the predetermined flow rate, the process may return to step S110.

Since the current flow rate is less than the lower limit of the predetermined flow rate range, the charge removal effect of the wafer 400 may be considered to be poor. The wafer 400 may have relatively many residual charges, which may cause the position of the wafer 400 to have a relatively large deviation. The charge removal operation may need to be performed again by returning to step S110.

In the specific operation process of the carrier device, in order to make the control of the carrier device relatively convenient and the processing process in order and facilitate an operator to code a control program, embodiments of the present disclosure may provide an operation method of the carrier device. By taking the carrier device shown in FIG. 4 as an example, the method includes the following steps.

At S200, the wafer 400 is placed on the thimble 220.

This process may be usually completed by a manipulator to realize material loading of the carrier device.

At S210, the position limiting segment 310 ascends to the first position (the upper end surface of the position limiting segment 310 is at position A), and the position limiting segment 310 is at least partially extended out of the mounting hole 110 at this time.

At S220, the thimble 220 is retracted to cause the wafer 400 to descend.

In this process, since radial distance D3 is greater than radial distance D2, the wafer 400 may not be in contact with the inner peripheral surface 131 of the focus ring 130 while the position of the wafer 400 is corrected, which prevents the focus ring 130 from being damaged to improve the yield of the wafer 400.

At S230, the position limiting segment 310 is retracted to the second position below the carrying surface 210, and the position limiting segment 310 is located within the mounting hole 110 at this time.

The positioning member 300 may be prevented from being extended out to affect the subsequent operation of the carrying device.

At S240, the wafer 400 is processed.

This operation may complete an etching process of the wafer 400.

At S250, the position limiting segment 310 ascends to the above-mentioned first position to be partially extended out of the mounting hole 110.

At S260, the charge is removed from the wafer 400, and the residual charge on the wafer 400 is detected.

Since the wafer 400 may be shifted during the process of removing the charge from the wafer 400 and detecting the residual charge on the wafer 400, the position limiting segment 310 may need to be at least partially extended out of the mounting hole 110 to limit the position of the wafer 400 to prevent the wafer 400 from having a large deviation.

At S270, the thimble 220 is extended to cause the wafer 400 to ascend.

After the charge removal of the wafer 400 is completed and the detection of the residual charge of the wafer 400 is qualified, the thimble 220 may be extended out to raise the wafer 400 to facilitate the manipulator to fetch At S280, the position limiting segment 310 is located at the second position below the carrying surface 210, and at this time the position limiting segment 310 is retracted into the mounting hole 110.

This process can avoid the interference between the positioning member 300 and the manipulator to cause an unnecessary production accident. Thus, the safety of the wafer 400 may be improved during production.

At S290, the wafer 400 is transferred out.

Thus, the entire processing process of one wafer 400 may be completed. The steps of the process may be clearly defined, which facilitates the operator to control the production operation of the carrier device.

The above embodiments of the present disclosure focus on describing the differences between the various embodiments. As long as the different optimization features of the various embodiments are not contradictory, the optimization features may be combined to form better embodiments, which are not repeated considering the brevity of the present specification.

The above are merely embodiments of the present disclosure, which are not used to limit the present disclosure. Various modifications and changes may be made to the present disclosure for those skilled in the art. Any modification, equivalent replacement, and improvement made within the spirit and principle of the present application shall be included within the scope of the claims of the present application.

What is claimed is:

1. A carrier device configured to carry a wafer in a semiconductor apparatus comprising:
    an electrostatic carrier plate including a carrying surface configured to carry the wafer; and
    at least three positioning members arranged around the carrying surface at intervals along a circumferential direction of the carrying surface, each of the positioning members including a position limiting segment, at least three position limiting segments forming a position limiting space above the carrying surface, and an opening size of the position limiting space increasing along a direction away from the carrying surface, and the position limiting space being configured to avoid deviation of a position of the wafer when charges are not completely removed from the wafer,
    wherein:
        the at least three positioning members pass through the electrostatic carrier plate in a vertical thickness direction of the electrostatic carrier plate;
        in a first position, the at least three position limiting segments are ascended in the vertical thickness direction to be above the carrying surface; and
        in a second position, the at least three position limiting segments are descended in the vertical thickness direction to be below the carrying surface.

2. The carrier device according to claim 1, wherein:
    one of the position limiting segments includes a rod body, and an inclined surface is formed on an outer peripheral wall of the rod body; or
    the position limiting segment is a conical segment.

3. The carrier device according to claim 1, further comprising: an annular base arranged around the carrying surface and including at least three mounting holes, the at least three positioning members being mounted in the mounting holes in a one-to-one correspondence and being able to ascend and descend relative to the annular base.

4. The carrier device according to claim 3, wherein the annular base includes:
    a base ring; and
    a focus ring arranged on the base ring and including an annular protrusion protruding from the carrying surface,
    wherein corresponding to the position limiting segment being at the first position, a radial distance between an inner peripheral wall of the annular protrusion and an edge of the carrying surface being greater than a radial distance between an inner sidewall of the position limiting segment and the edge of the carrying surface.

5. The carrier device according to claim 3, wherein the electrostatic carrier plate includes: an electrostatic chuck; and at least three thimbles retractably arranged in the electrostatic chuck, arranged at intervals along a circumferential direction of the electrostatic chuck, and configured to lift the wafer to a wafer pick-and-place position, when the wafer is in the wafer pick-and-place position, on a vertical cross-section perpendicular to the carrying surface, an orthographic projection of the inner sidewall of the position limiting segment having a radial direction between a position at a same height as a lower edge of the wafer and the lower edge of the wafer, and the radial distance being less than a predetermined warning value.

6. The carrier device according to claim 3 further comprising a drive mechanism, the at least three positioning members being connected to the drive mechanism, and the drive mechanism being configured to drive the at least three position limiting segments to ascend and descend synchronously.

7. The carrier device according to claim 6, wherein the drive mechanism includes:
    an ascending and descending drive source; a transmitter; and
    at least three vacuum bellows, one end of each of the vacuum bellows being connected to each of the positioning members in a one-to-one correspondence, and the vacuum bellows being sealed with and connected to a bottom of the electrostatic carrier plate to seal the mounting holes, and the other end of each of the vacuum bellows being connected to a first end of the transmitter, and a second end of the transmitter being connected to the ascending and descending drive source.

8. The carrier device according to claim 7, wherein the ascending and descending drive source includes a linear motor or a hydraulic extension and retraction rod.

9. The carrier device according to claim 3, wherein:
    the mounting holes are circular holes; and
    the positioning members are cylindrical rods, diameters of the circular holes being larger than diameters of the cylindrical rods, and a difference between a diameter of one of the mounting holes and a diameter of a cylindrical rod ranges from 0.5 mm to 2 mm.

10. The carrier device according to claim 1, wherein the positioning members are resin members.

11. The carrier device according to claim 1, wherein the at least three positioning members are evenly distributed along the circumferential direction of the carrying surface.

12. A semiconductor apparatus comprising a reaction chamber including a carrier device, the carrier device including:
    an electrostatic carrier plate including a carrying surface configured to carry a wafer; and at least three positioning members, the electrostatic carrier plate includes a carrying surface configured to carry the wafer, the at least three positioning members are arranged around the carrying surface at intervals along a circumferential direction of the carrying surface, each of the positioning members is provided with including a position limiting segment, at least three position limiting segments forming a position limiting space above the carrying surface, and an opening size of the position limiting space increasing along a direction away from the carrying surface, and the position limiting space being configured to avoid deviation of a position of the wafer when charges are not completely removed from the wafer, wherein:
- the at least three positioning members pass through the electrostatic carrier plate in a vertical thickness direction of the electrostatic carrier plate;
- in a first position, the at least three position limiting segments are ascended in the vertical thickness direction to be above the carrying surface; and
- in a second position, the at least three position limiting segments are descended in the vertical thickness direction to be below the carrying surface.

13. A residual charge detection method applicable to the semiconductor apparatus of claim 12 comprising:
- introducing process gas into the reaction chamber of the semiconductor apparatus, and turning on a power supply of an upper electrode of the semiconductor apparatus to perform plasma ignition;
- after the ignition is completed, applying a reverse voltage to the electrostatic carrier plate to remove residual charges on the wafer;
- turning on a back blowing gas control device of the semiconductor apparatus to introduce back blowing gas between the carrying surface and the wafer;
- detecting a current flow rate of the back blowing gas when a back blowing pressure between the carrying surface and the wafer is a predetermined pressure; and
- comparing the current flow rate with a predetermined flow rate range, and determining whether the residual charges still exist on the wafer according to a comparison result.

14. The method according to claim 13, wherein comparing the current flow rate with a predetermined flow rate range, and determining whether the residual charges still exist on the wafer according to a comparison result includes:
- in response to the current flow rate being greater than or equal to an upper limit of the predetermined flow rate range, determining that no residual charge exists on the wafer; and
- in response to the current flow rate being less than the upper limit of the predetermined flow rate range, determining that the residual charges exist on the wafer.

15. The method according to claim 14, wherein in response to the current flow rate being less than the upper limit of the predetermined flow range and greater than or equal to a lower limit of the predetermined flow range:
- turning on the back blowing gas control device to introduce back blowing gas between the carrying surface and the wafer is performed;
- adjusting the back blowing pressure to 1.5 to 2.5 times of the predetermined pressure;
- after a predetermined duration, restoring the back blowing pressure to the predetermined pressure; and
- detecting a current flow rate of the back blowing gas when a back blowing pressure between the carrying surface and the wafer is a predetermined pressure is performed.

16. The method according to claim 14, wherein in response to the current flow rate being less than the lower limit of the predetermined flow rate range, introducing process gas into the reaction chamber of the semiconductor apparatus and turning on power supply of an upper electrode to perform plasma ignition is performed.

17. The carrier device according to claim 1, wherein:
- in the first position, a position where a cross-section of the position limiting segment is the smallest is lower than the carrying surface to ensure that the inclined surface covers the space above the carrying surface.

* * * * *